(12) United States Patent
Rieger et al.

(10) Patent No.: US 7,595,792 B2
(45) Date of Patent: Sep. 29, 2009

(54) MEASURING APPARATUS WITH VALUE EDITOR AND CORRESPONDING METHOD

(75) Inventors: Angela Rieger, Munich (DE); Kurt Lainer, Kirchheim bei Munich (DE); Bernhard Reifert, Muehldorf (DE); Valentin Illich, Munich (DE); Sebastian Thoma, Rosenheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 281 days.

(21) Appl. No.: 10/477,939

(22) PCT Filed: Apr. 30, 2002

(86) PCT No.: PCT/EP02/04760

§ 371 (c)(1),
(2), (4) Date: Jun. 7, 2004

(87) PCT Pub. No.: WO02/095567

PCT Pub. Date: Nov. 28, 2002

(65) Prior Publication Data

US 2004/0206192 A1 Oct. 21, 2004

(30) Foreign Application Priority Data

May 18, 2001 (DE) .................... 101 24 371
Aug. 10, 2001 (DE) .................... 101 39 495

(51) Int. Cl.
G06F 3/033 (2006.01)
G06F 3/00 (2006.01)
G01R 19/00 (2006.01)
G09G 5/00 (2006.01)

(52) U.S. Cl. ............... 345/184; 715/866; 324/76.11

(58) Field of Classification Search ............ 345/157, 345/440.1; 324/76.11–22; 702/76; 708/142
See application file for complete search history.

(56) References Cited

U.S. PATENT DOCUMENTS

| | | | | | |
|---|---|---|---|---|---|
| 3,553,445 | A | * | 1/1971 | Hernandez | 708/142 |
| 4,647,915 | A | * | 3/1987 | Shank et al. | 345/157 |
| 4,703,433 | A | * | 10/1987 | Sharrit | 702/76 |
| 4,818,931 | A | | 4/1989 | Naegeli et al. | |
| 4,972,138 | A | | 11/1990 | Bush | |
| 5,321,420 | A | | 6/1994 | Rezek et al. | |
| 5,481,741 | A | * | 1/1996 | McKaskle et al. | 345/522 |
| 5,550,747 | A | | 8/1996 | Newman | |
| 6,320,577 | B1 | * | 11/2001 | Alexander | 345/440.1 |
| 6,690,398 | B1 | * | 2/2004 | Beck et al. | 702/67 |

FOREIGN PATENT DOCUMENTS

| | | |
|---|---|---|
| DE | 37 43 543 A1 | 7/1989 |
| DE | 42 20 145 A1 | 12/1992 |
| DE | 199 10 902 A1 | 10/1999 |

* cited by examiner

Primary Examiner—Sumati Lefkowitz
Assistant Examiner—William L Boddie
(74) Attorney, Agent, or Firm—Ditthavong Mori & Steiner, P.C.

(57) ABSTRACT

A value editor and a corresponding method is described for a measuring apparatus, by which setting parameter values can be modified. Parameters can be set for at one of multiple functional units and modified by control elements. Multiple control elements can together constitute a control block and the active control block is highlighted by a focus. To modify parameter values in the highlighted focus, displayed alphanumerically in the control elements, a first or second edit mode can be selected.

29 Claims, 5 Drawing Sheets

| Key | Alphanumeric Characters |
|---|---|
| 1 | abc1! |
| 2 | def2" |
| 3 | ghi3§ |
| 4 | jkl4$ |
| 5 | mno5% |
| 6 | pqr6& |
| 7 | stu7/ |
| 8 | vwx8( |
| 9 | yz_9) |
| 0 | ,;\0= |
| . | .*/? |
| - | -+#' |

Fig. 9

MEASURING APPARATUS WITH VALUE EDITOR AND CORRESPONDING METHOD

FIELD OF THE INVENTION

The invention relates to a measuring device, or apparatus with a value editor for entering the values of adjustment parameters for functional units of the measuring device via operating elements, and a corresponding method and computer program for implementation of the steps of the method.

BACKGROUND OF THE INVENTION

When entering the values of adjustment parameters for the functional units in measuring devices, it is conventional to open an adjustment parameter which can then be adjusted by means of an associated key in an operating field disposed on a front panel. The value of the adjustment parameter can then be adjusted, for example, by means of a rotary knob. In this context, a set value of the adjustment parameter can only be changed by means of a specified function. The operator does not have the option to use another edit function.

In practice, this leads to awkward handling of the measuring device, because different edit functions are sometimes more suitable for different uses.

Regarding the technical background, reference is made to U.S. Pat. No. 5,953,009. This document describes the allocation of trigger functions to a measuring channel of a digital oscilloscope by clicking and dragging icons symbolising trigger functions on the user interface. The signal flow for individual functional units and the function of these functional units cannot however be recognized or selected at the user interface.

SUMMARY OF THE INVENTION

A need therefore exists to provide a measuring device with a value editor with several functionalities for entering values of adjustment parameters and a corresponding method and computer program.

To edit the values of adjustment parameters, the measuring device according to an embodiment of the invention provides different editing functionalities, which can be switched on automatically by means of a logical allocation to the entering means. In particular, this provides the user with the advantage that intuitive operation of the measuring device is possible. For example, selection of an adjustment parameter to be adjusted does not take place in an abstract manner by means of a keystroke on an associated key in the operating field on the front panel, but rather by marking an operating block, which represents the adjustment parameter and in which the operator can perceive at a glance all the information relevant to an adjustment parameter. The adjustment parameters which can be edited at any one time are displayed in a display device, so that the operator does not need to use a large number of operating keys on the measuring device or to follow a hierarchical structure before reaching the relevant adjustment parameters.

In particular, automatic selection of an edit mode by activating an entry option chosen in dependence upon the edit mode to be opened, practically excludes error operation. Operation is limited to a few operating keys, the function of which is automatically displayed during actual operation.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

An exemplary embodiment of the measuring device according to the invention and the method according to the invention is described in greater detail below with reference to the drawings. The drawings are as follows:

FIG. 7 shows an example of a detail from a display with a second edit mode switched on;

DETAILED DESCRIPTION OF THE PREFERRED EMBODIMENT

Figure 1:
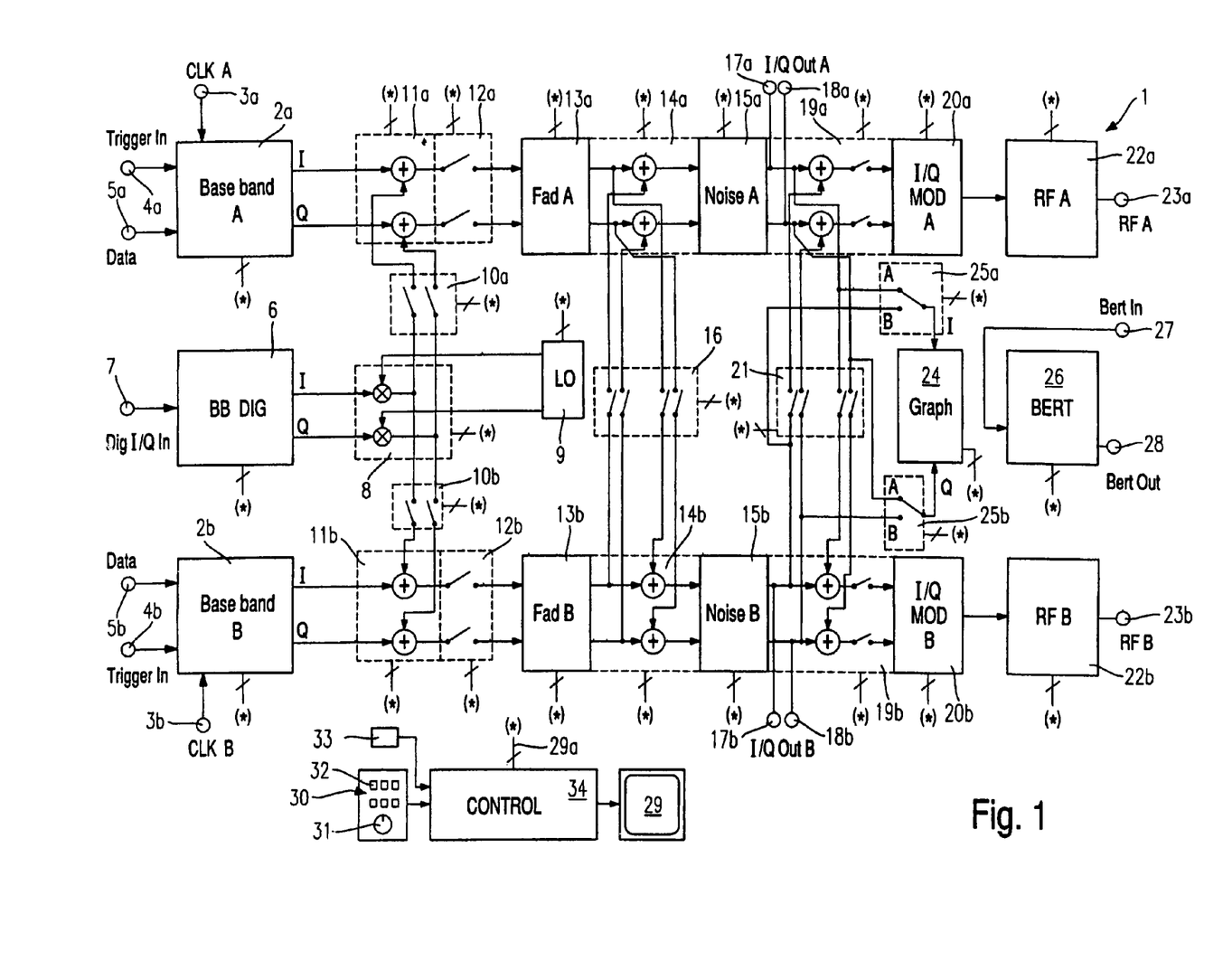
FIG. 1 shows a block circuit diagram of an exemplary embodiment of a signal generator designed as a measuring device according to the invention.

Before the exemplary embodiments of the graphic display and the function of the value editor according to the invention are described with reference to FIGS. 4 to numeral 8, a block circuit diagram of a signal generator will first be described with reference to FIG. 1. This signal generator is designed as a measuring device 1 according to the invention. Moreover, with reference to FIGS. 2 and 3, one example of the functional blocks displayed on the display device and an open dialog window for a functional block is explained. The measuring device 1 need not necessarily be a signal generator; it may, for example, also be a protocol tester or a spectrum analyser.

The signal generator 1 comprises a first base band unit 2a and a second base band unit 2b. The base band units 2a and 2b generate base band signals at their I and Q outputs according to predefined standards which can be selected by the user, for example, according to the GSM standard, the GSM-EDGE standard or the Wideband-CDMA standard. The base band units 2a, 2b are supplied with clock signals at ports 3a, 3b, trigger signals at ports 4a and/or 4b and modulation data at ports 5a and/or 5b. In the exemplary embodiment illustrated, a digital base band generator unit 6 is provided alongside these units, which generates the I and Q components of a further base band signal from digital I/Q-values supplied to port 7. The output signal from the digital base band generator 6 can be multiplied in a multiplication unit 8, to which the constant frequency from an adjustable local oscillator 9 is supplied.

The optionally multiplied base band signal from the digital base band generating unit 6 can be supplied via a switching element 10*a* and/or a second switching element 10*b*, to the digital addition unit 11*a* or digital addition unit 11*b*.

The output signal from the base band units 2*a* and 2*b* and/or from the addition units 11*a* and 11*b* is supplied, via a switching element 12*a* and/or a switching element 12*b*, to a fading unit 13*a* and/or 13*b*, which applies fading (variable shrinkage) to the base and signal. The functions of the fading units 13*a* and 13*b*, such as the number, the time delay and the attenuation of the signal delay paths implemented in the fading unit can be specified by the user. The fading units 13*a* and 13*b* are connected via an addition unit 14*a* and/or 14*b* in each case to a noise unit 15*a* and/or 15*b*. The noise units 15*a*, 15*b* apply a noise signal, which can be specified by the user, to the base band signal, wherein, for example, the type and level of the noise signal generated by the noise unit 15*a*, 15*b* can be selected by the user.

Instead of providing a separate connection of the relevant fading units 13*a* and/or 13*b* to the allocated noise unit 15*a* and/or 15*b*, the output signals from the fading units 13*a*, 13*b* can be added by means of a switching element 16 which connects the addition units 14*a* and 14*b*, and supplied in each case, to one of the two noise units 15*a* and/or 15*b*. The I/Q-output signals at the output of the noise units 15*a* and/or 15*b* can be tapped at ports 17*a* and 18*a* or 17*b* and 18*b*.

The output signals from the noise units 17*a* and 17*b* can be supplied to I/Q-modulators 20*a* and/or 20*b* via addition units and switching units 19*a* and 19*b*. In this context, the output signals from the noise units 15*a* and 15*b* can be added via a switching element 21 and supplied to one of the two I/Q-modulators 20*a* and/or 20*b*. With reference to the function of the I/Q-modulators 20*a* and/or 20*b*, several user-specific selection options are also available. For example, the I/Q-modulator 20*a*, 20*b* can be operated in such a manner that it generates a burst-sequence, wherein the active bursts and/or the level of the active bursts can be selected by the user.

The I/Q-modulators 20*a* and 20*b* are each connected to a high-frequency unit 22*a* and/or 22*b*, and a high-frequency signal can be picked up at port 23*a* and/or 23*b*. For example, the output frequency or several output frequencies initiated according to the sudden frequency change procedure of the high frequency unit 22*a* and 22*b* can be selected by the user.

Additionally, a signal display 24 is provided, which, in the exemplary embodiment, can be connected via switching elements 25*a* and/or 25*b* to the output of the noise unit 15*a* or the noise unit 15*b*. Alternatively, it is also conceivable for the display device 24 to be connected directly to the outputs of the base band units 2*a* and 2*b*. For example, the signal display 24 allows a display of the constellation diagram, so that the user can monitor the method of operation of the connected signal paths.

Furthermore, a Bit Error Rate Tester (BERT) 26 is provided in such a manner that a signal from the device under test (DUT) can be supplied to the input port 27 of the Bit Error Rate Tester allowing the bit error rate of the signal to be picked up at the output port 28.

Further functional units and variant combinations of the functional units may also be provided. These have not been explained in greater detail for the sake of simplicity.

All of the functional units described above: 2*a*, 2*b*, 6, 8, 9, 10*a*, 10*b*, 11*a*, 11*b*, 12*a*, 12*b*, 13*a*, 13*b*, 14*a*, 14*b*, 15*a*, 15*b*, 16, 19*a*, 19*b*, 20*a*, 20*b*, 21, 22*a*, 22*b*, 24 and 26 are connected via a control bus to a control device such as a CPU. The connection of the control bus to the functional units is indicated with the symbol (*). The control unit 34 controls the configuration and function of the individual functional units as required by the user. The current configuration of the functional units is displayed on the display device 29, which, together with the operating elements 30 may be disposed on the front panel of the signal generator 1. For this purpose, a graphic functional block is allocated to each functional unit, and the interconnection of the functional units is displayed on the display device 29 by corresponding connecting elements, which interconnect the functional blocks. The connections between the functional blocks and the functions of the functional blocks are selected either with a rotary knob 31 and/or corresponding operating buttons 32 or via a mobile positioning element 33 (mouse).

Figure 2:
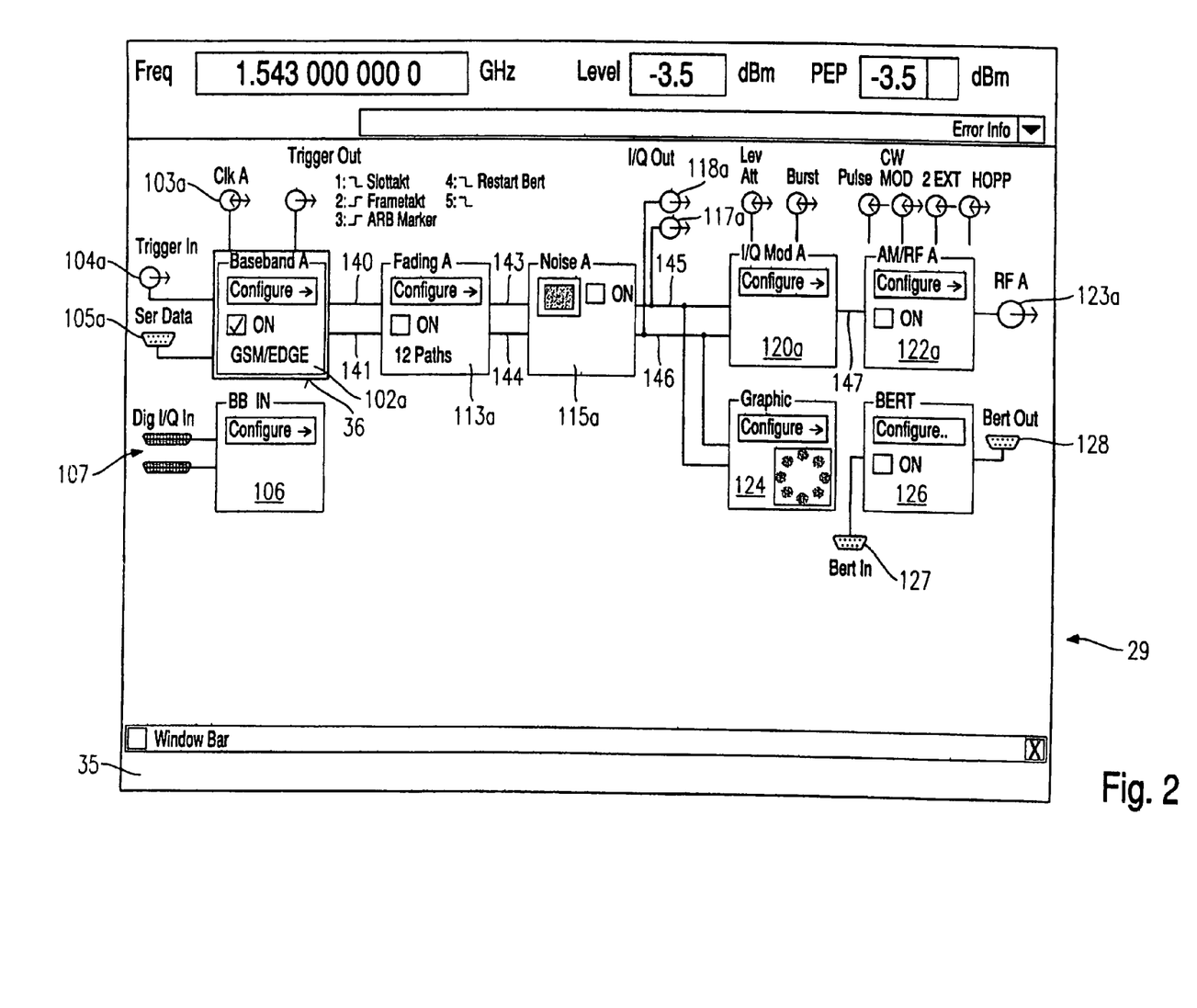
FIG. 2 shows an example of a view of the display device with functional units of the measuring device displayed as functional blocks.

FIG. 2 shows the display interface of the display device 29 in an initial functional example. It can be seen that the functional blocks presented on the display 29 correspond to the functional units described with reference FIG. 1. The reference numbers for the functional blocks are greater, in each case by the value 100, than the reference numbers for the functional units presented in FIG. 1. In FIG. 2, a first base band block 102*a* corresponding to the first base band unit 2*a*, a first fading block 113*a* corresponding to the first fading unit 13*a* and a first noise block 115*a* corresponding to the first noise unit 15*a*, a first I/Q-modulator block 120*a* corresponding to the first I/Q-modulator 20*a*, a first high-frequency block 122*a* corresponding to the first high-frequency block 22*a*, a display field 124 corresponding to the signal display 24 and a bit error rate test block 126 corresponding to the bit error rate tester 26, are displayed as functional blocks. In this context, the signal inputs and outputs and the data inputs and outputs 103*a*, 104*a*, 105*a*, 107, 117*a*, 118*a*, 123*a*, 127 and 128 correspond to the ports 3*a*, 4*a*, 5*a*, 7, 17*a*, 18*a*, 23*a*, 27 and 28 as shown in FIG. 1.

By observing the display device 29, the user can recognize at a glance, on the basis of the functional blocks displayed, which functional units have been selected and connected for the current functions of the measuring device 1. Furthermore, the user can immediately recognize which inputs and outputs are provided with signals and in which manner. The internal signal flow and therefore also the signal conditioning are presented to the user in a very transparent manner. For example, the user can immediately see that the fading unit 13*a* is arranged in front of the noise unit 15*a*, whether the bursting of the signal is implemented in the base band or in the high-frequency band, and to which ports external signals can be applied and how these will influence the signal flow. In particular, the user can immediately identify whether a port is acting as an input or an output. Current configurations can be identified in the functional blocks, particularly important parameters being displayed directly in the functional blocks. Moreover, the user can clearly see at which position the signal display 24 is connected into the signal path.

Figure 3:
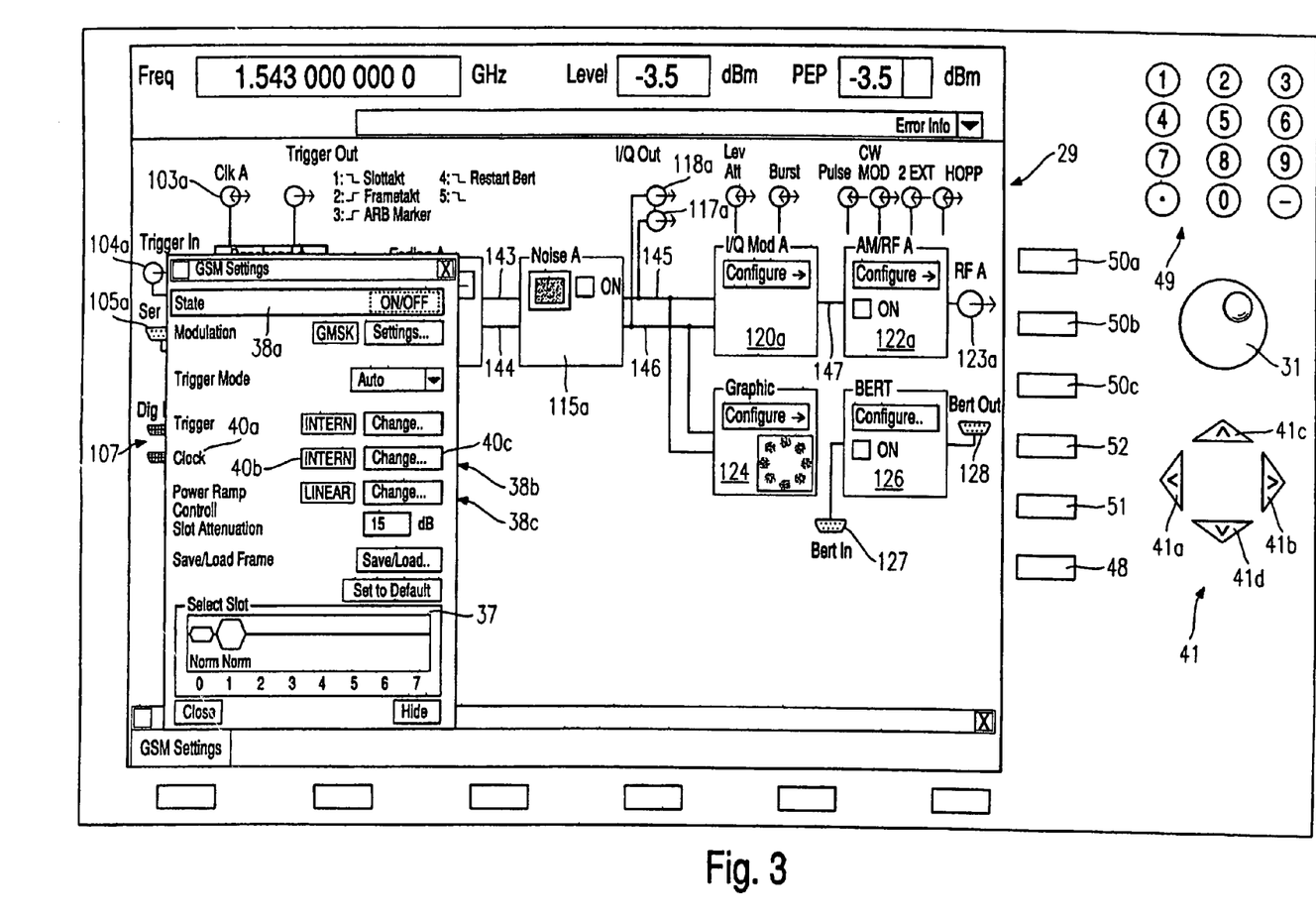
FIG. 3 shows an example of a display device with an open dialog window.

If the functional block 102*a*, marked with a black marking frame (marking) 36 in FIG. 2 is selected, for example after previously selecting the "GSM/EDGE" standard via a function selection list, a dialog window 37 will be displayed in the foreground of the display device 29 as shown in FIG. 3. Within the dialog window 37, several operating blocks are provided, of which some are displayed with reference symbols 38*a*, 38*b*, 38*c*. The operating blocks themselves are generally made up from several operating elements. In FIG. 3, this is shown for operating block 38*b*, which is built up from three operating elements 40*a*, 40*b* and 40*c*. One operating block in each case can be selected via the operating focus 39. Navigation of the operating focus 39 is by means of the rotary knob 31 used as a positioning element in combination with the direction keys 41.

Various designs are possible for the operating elements. In the example shown, the operating element 40*a* is passive, that is to say, it is no longer possible to make an entry, and only the name of the adjustment parameter is shown. By contrast, in the case of the operating elements 40b and 40c, it is possible to make entries. For this purpose, an entry can either be made using the value editor explained in greater detail below, or using a further menu which is not shown in this case, which is opened, for example, when the operating element 40c, which is designed as a switching surface, is activated.

FIGS. 4 to 8 explain the method of functioning of the value editor for adjusting a frequency value with reference to an operating block 42a. In the illustrated detail of the display device 29, six other operating blocks 42b to 42g are shown alongside the operating block 42a; which can be selected by shifting the operating focus 39 shown as a black frame. The devices required to operate the value editor are arranged on the front panel of the measuring device 1. The reference numbers used relate to the front panel of the measuring device 1 as shown in FIG. 3.

Figure 4:
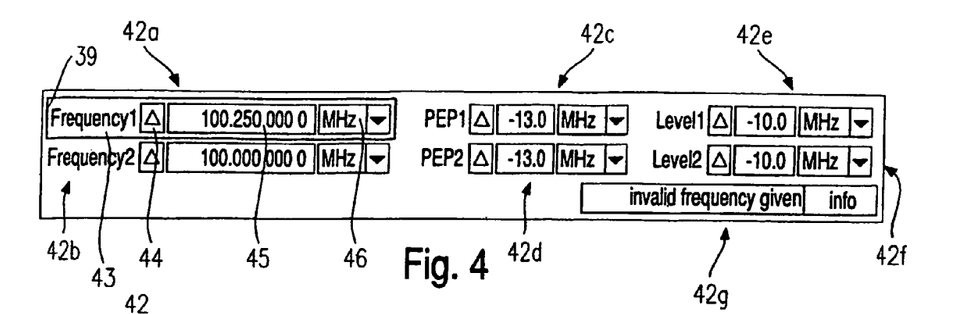
FIG. 4 shows an example of a detail from a display of the display device with a highlighted operating block.

The operating block 42a shown in FIG. 4 comprises all of the elements required for adjusting a given frequency, for example, of a signal from the signal generator, thereby completely describing the adjustment parameter "Frequency 1". For this purpose, alongside the parameter name 43, an operating element 45, which is designed as an entry field for a numerical value, and a further operating element 46, which is designed as an entry field for a physical unit, are provided. By contrast with operating element 45, operating element 46 provides pre-defined values, so that a selection can be made from the pre-defined values. An operating element 44 is also provided in the operating block 42a, the selection of which will select a given edit function of the value editor, which will be described in greater detail below.

For example, in order to implement a change to the adjustment parameter "Frequency 1" starting from the frequency of 100.250 000 0 MHz as presented in the example, a first or a second edit mode of the value editor can be adjusted. In principle, the first edit mode differs from the second edit mode in that, in the first edit mode, the frequency value is changed starting from the most recently adjusted frequency value. In this context, it is possible within the first edit mode to select between a first and second variation function, wherein the first variation function acts on an individual tens digit of the frequency value adjusted. By contrast, the second variation function, increases or decreases the adjusted frequency value by a fixed increment on the basis of the most recently adjusted frequency value. In the second edit mode, it is possible to enter a numerical value for the frequency directly.

Figure 5:
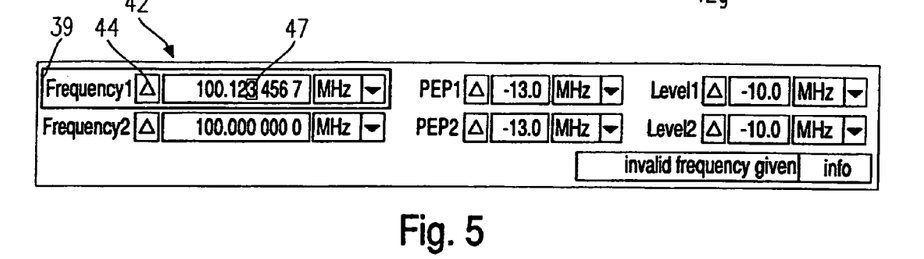
FIG. 5 shows an example of a detail from a display with a first variation function opened in a first edit mode.

In each case, the value editor is switched on for the operating block which is highlighted in the operating focus 39. The first edit mode is switched on by activating a selection means. For example, an entry key 52 or a push button integrated into the rotary knob 31 may be designed as the selection means. When the first edit mode is activated, the first variation function is opened as a default setting. This is indicated in the display device 29 as shown in FIG. 5, in that one digit of the numerically displayed value of the adjustment parameter "Frequency 1" is highlighted by an entry focus 47.

When the first variation function is called up, that character from an alphanumerical character string in the operating element 45, which is highlighted by the entry focus 47, can be changed. In this context, the change is implemented by turning the rotary knob 31. With every pulse which is emitted via the rotary knob 31, which is designed as a pulse generator, the highlighted character is raised or lowered by the value "one" depending on whether the rotary knob 31 is rotated in the clockwise or anticlockwise direction. For a numerical value, this therefore leads to an addition or subtraction of the numerical value "one" from the relevant number. In the case of an alphanumerical character string, the relevant character is changed to the adjacent letter of the alphabet. In this context, the letters of the alphabet can also be supplemented by special characters. As an alternative to using the rotary knob 31, the character highlighted by the entry focus 47 can also be changed by repeatedly pressing the direction keys 41c or 41d.

In the case of a numerically displayed value, raising the value of a tens digit can lead to a counter over-flow, if a tens digit of the value "nine" is further increased. The next higher tens digit is then automatically adjusted. Tens digits influenced by a counter under-flow are also adjusted accordingly.

Within the character string, the entry focus 47 can be moved in each case by one place using the direction keys 41a and 41b. The character adjacent to the highlighted character to the right or the left is then highlighted by the entry focus 47 and, the entry focus 47 can be moved stepwise to the position of the character to be changed.

Figure 6:
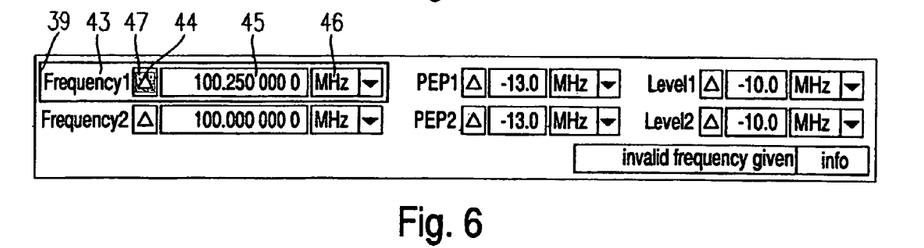
FIG. 6 shows an example of a detail from a display with a second variation function opened in a first edit mode.

The second variation function is opened by activating a switching key (toggle key) 48, and the increment symbol in the operating element 44 is highlighted by the entry focus 47, as shown in FIG. 6. When the second variation function is opened, turning the rotary knob 31 changes the numerical value of the adjustment parameter displayed in the operating element 45 by a predetermined increment for every pulse generated by the rotary knob 31. When the second variation function is called up, the increment has already been determined. The increment may be determined, for example, via a configuration menu. The numerical value of the operating element 45 is raised or lowered in dependence upon the direction of rotation of the rotary knob 31. The direction keys 41c and 41d may be used, as an alternative to the rotary knob 31, to adjust the required value of the operating element 45. Each time the push-button function of the rotary knob 31 or the entry key 52 is activated, the first edit mode is left, and the user can change to another adjustment parameter or into the second edit mode by navigating the operating focus 39.

Figure 9:
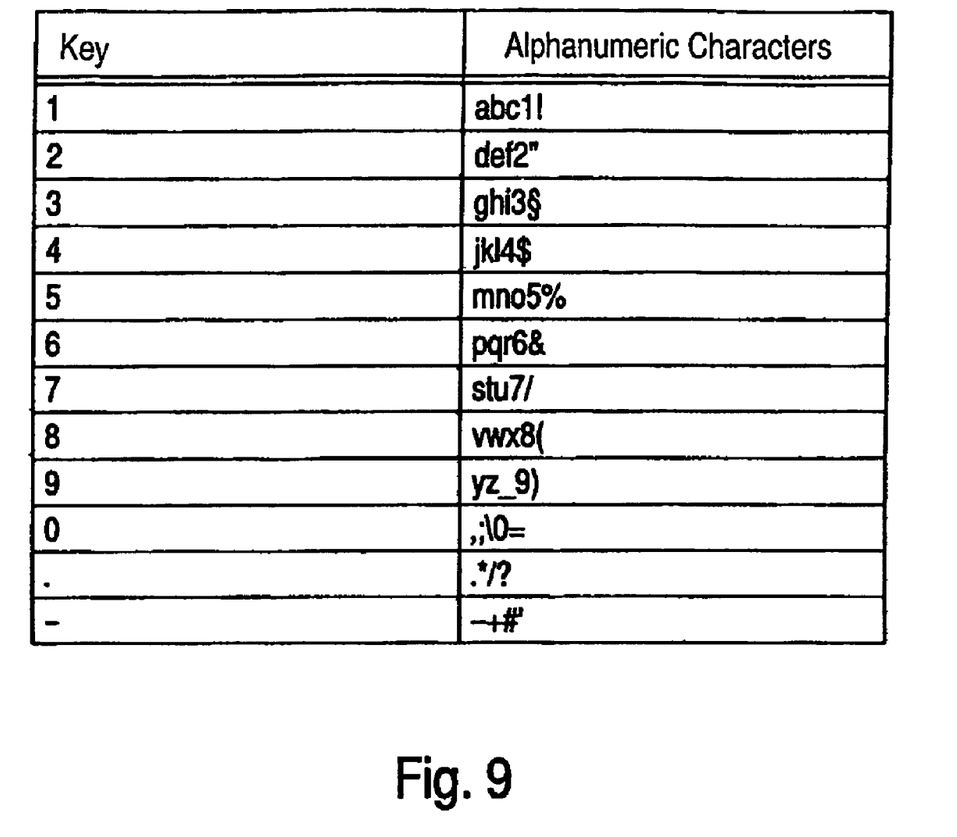
FIG. 9 provides a tabular overview of the multiple definition of the keys in the keypad.

If an operating block is selected with the operating focus 39, and the first edit mode is not switched on, the second edit mode can be switched on by entering a first character in the keypad 49. When the second edit mode is switched on, the character string displayed in the operating element 45 is deleted. The desired value, in the example shown in FIG. 7, a numerical value for the adjustment parameter "Frequency 1", can be entered directly by entering a sequence of characters via the keypad 49 and will then be displayed in the display field of the operating element 45. To allow a sequence of letters to be entered, the individual keys of the keypad 49 have a multiple definition, so that different characters can be entered by repeatedly pressing a key. A sample definition of the keypad 49 shown in FIG. 3 is presented in tabular form in FIG. 9.

Figure 7:
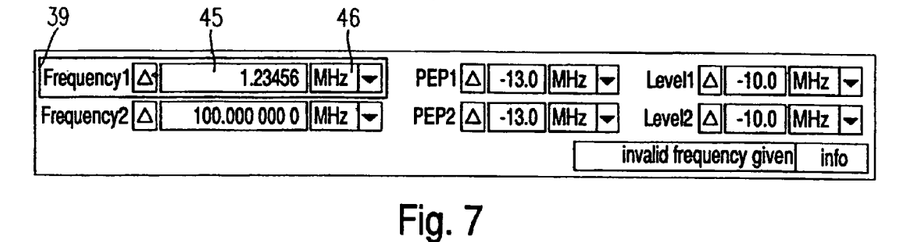

After entering a numerical value for the frequency "Frequency 1" to be adjusted, the entry for the adjustment parameter is completed by establishing a physical unit. Two options are available to the user of the measuring device 1. In the second edit mode, a direct and indirect entry of the physical unit is possible. The direct entry takes place via three unit keys 50a to 50c. The basic physical unit is established for the adjustment parameter. For the adjustment parameter "Frequency 1", the unit is "Hertz". The basic unit can be scaled via the unit keys. For this purpose, two meanings are allocated to each of the unit keys 50*a* to 50*c*, so that the user can switch between the two meanings using multiple key strokes. For example, the unit key 50*a* switches between the meanings "nano" and "giga". The numerical value entered for the adjustment parameter is then scaled by the power of ten corresponding to the entry "nano" or "giga". The meanings "micro" and "mega" are provided for the entry key 50*b*, and the meanings "milli" and "kilo" are assigned to the entry key 50*c*. The distribution of meanings to the unit keys 50*a* to 50*c* allows a scaling with factors from $10^{-9}$ to $10^{+9}$. In this context, the scaling factors are assigned to the unit keys 50*a* to 50*c* in such a manner that exponents of the same magnitude but with opposite signs in each case jointly define one unit key 50*a*, 50*b* or 50*c*. When the unit has been entered via one of the unit keys 50*a*, 50*b* or 50*c* and the associated scaling factor has been transferred to the control unit, the second edit mode is terminated and the operating focus 39 can be moved to an operating block for another adjustment parameter.

Figure 8:
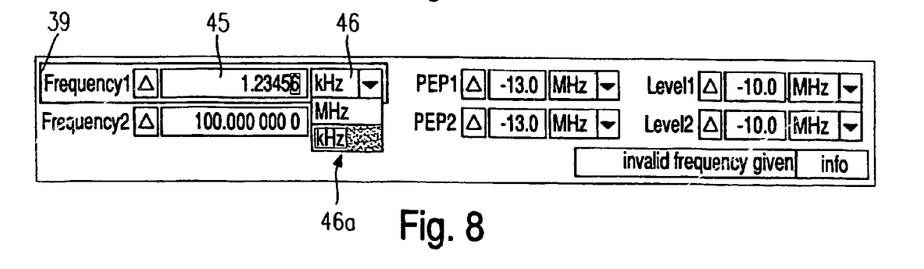
FIG. 8 shows an example of a detail from a display with a selection list open.

Alternatively, a unit may be selected via a selection list 46*a*. For this purpose, the operating element 46 is predefined with reference to the associated adjustment parameter. The selection list 46*a* is displayed by activating the switching key 48. At the same time, the entry focus 47 is moved within the selection list 46*a*, so that the currently set unit is highlighted by the entry focus. The entry focus 39 can be moved within the selection list 46*a* by turning the rotary knob 31. When the entry focus is positioned over the desired unit, the highlighted unit can be selected by pressing the rotary knob 31 or the entry key 52. As in the case of selecting a unit using the unit keys 50*a* to 50*c*, the second edit mode is also closed when a unit has been selected via the selection list 46*a* of the operating element 46. The selection list 46*a* can also be displayed by pressing the direction key 41*b* instead of the switching key 48.

If a change of the unit is not required, because the last adjusted unit still applies for the newly entered numerical value, selection of a unit may also be omitted. The second edit mode is then closed by activating the selection means, for example, the entry key 52. If the quit key 51 is activated before leaving the edit mode, the numerical value applicable before changing the adjusted numerical value will be restored.

Both the first and the second edit mode can be closed at any time by activating the quit key 51. In this context, in the second edit mode, the numerical values and units last adjusted before the change will be restored, and a new operating block 42*a* to 42*g* can again be marked by moving the operating focus 39.

While the present invention has been described in connection with a number of embodiments and implementations, the present invention is not so limited but covers various obvious modifications and equivalent arrangements, which fall within the purview of the appended claims.

The invention claimed is:

1. A measuring device comprising:
a plurality of functional units having adjustment parameters that can be adjusted;
a control device configured to control adjustment of the adjustment parameters using corresponding operating elements; and
a display device configured to display the plurality of functional units as functional blocks having the operating elements,
wherein the display device is configured to depict connectivity of the plurality of functional units by depicting corresponding connectivity of the plurality of functional blocks, the display device being configured to display a dialog window of a selected functional block in a foreground of the display of the plurality of functional blocks, wherein the dialog window includes operating elements that can be used to adjust the adjustment parameters of the selected functional block,
wherein the control device can be manipulated to highlight a plurality of the operating elements on the display device, wherein the control device is configured to switch on a value editor for each of the highlighted plurality of the operating elements, and wherein the control device has at least two edit modes configured to enter a change to alphanumeric values of the highlighted plurality of the operating elements in order to adjust corresponding adjustment parameters,
wherein a first edit mode of the at least two edit modes is configured to allow for adjustment of the alphanumeric values using a most recently adjusted alphanumeric value as a starting value and adjusting the starting value, wherein the first edit mode comprises a first variation function and a second variation function, and both variation functions can be opened alternately by activating a switching key, wherein the switching key is separate from controls used to adjust the first variation function and the second variation function,
wherein a second edit mode of the at least two edit modes is configured to allow for adjustment of the alphanumeric values by directly entering alphanumeric values using a keypad, and
wherein the plurality of functional units includes baseband units configured to generate baseband signals, fading units configured to apply fading to the baseband signals, noise units configured to apply a noise signal to the baseband signals, and I/Q modulators configured to receive the baseband signals from the noise units, high-frequency units connected to the I/Q modulators and configured to send a high-frequency signal to a device under test, a signal display configured to monitor the baseband signals at various locations via switching elements, and a bit error rate tester configured to receive a signal from the device under test.

2. A measuring device according to claim 1, wherein the first variation function is configured to allow adjustment of an individual character of an alphanumeric character string, and wherein the second variation function is configured to allow adjustment of an overall alphanumeric character string in increments.

3. A measuring device according to claim 2, wherein, when the first variation function is further configured to be opened by activating a pulse generator, the individual character in the alphanumerical character string displayed in an operating element is highlighted by an entry focus.

4. A measuring device according to claim 3, wherein the entry focus can be moved in each case to an adjacent character of the alphanumerical character string by activating direction keys.

5. A measuring device according to claim 3, wherein a correct change of a tens digit in a numerically displayed value of the operating element influenced by a counter over-run or a counter under-run is implemented automatically when the value of the tens digit is changed.

6. A measuring device according to claim 2, wherein, when the second variation function is open, a value of an adjustment parameter displayed numerically in an operating element can be changed in a pre-determinable fixed increment by activating a pulse generator.

7. A measuring device according to claim 2, wherein the open condition of the second variation function can be indicated with an entry focus by highlighting a symbol of an operating element.

8. A measuring device according to claim 2, wherein, when the second edit mode of the at least two edit modes is switched on, an alphanumerical character string displayed in an operating element can be overwritten by means of the keypad by entering a sequence of characters.

9. A measuring device according to claim 8, wherein, when a first character is entered by means of the keypad, the string of characters which is to be overwritten in the operating element is deleted.

10. A measuring device according to claim 8, wherein, when the second edit mode is switched on, a selection list of physical units can be displayed so that a physical unit of an adjustment parameter can be selected by activating the switching key.

11. A measuring device according to claim 10, wherein, when the second edit mode is switched on, the physical unit can be adjusted directly by pressing a unit key.

12. A measuring device according to claim 10, wherein the numerically entered value of an adjustment parameter corresponding to the physical unit displayed in the operating element can be scaled.

13. A measuring device according to claim 10, wherein the selection of a physical unit terminates the second edit mode.

14. A measuring device according to claim 1, wherein the first or second edit mode of the at least two edit modes can be terminated by activating a selection means.

15. A measuring device according to claim 1, wherein the second edit mode of the at least two edit modes can be quit by activating a quit key, and the values in the operating elements for the adjustment parameters which were displayed before the entry of a change are restored.

16. A measuring device according to claim 1, wherein the highlighted plurality of the operating elements can be moved by means of a positioning element and/or a direction key.

17. A method for entering values for adjustment parameters, wherein a plurality of functional units have adjustment parameters that can be adjusted, and wherein a control device is provided to control adjustment of the adjustment parameter using corresponding operating elements, and a display device is provided to display the plurality of functional units as functional blocks having the operating elements, the method comprising:
depicting on the display device connectivity of the plurality of functional units by depicting corresponding connectivity of the plurality of functional blocks;
depicting on the display device a dialog window of a selected functional block in a foreground of the display of the plurality of functional blocks, wherein the dialog window includes operating elements that can be used to adjust the adjustment parameters of the selected functional block;
manipulating the control device to highlight a plurality of the operating elements on the display device, wherein a value editor is switched on for each of the highlighted plurality of the operating elements;
selecting a first or second edit mode; and
changing a value of an adjustment parameter in the first edit mode by varying an alphanumeric value displayed alphanumerically in an operating element of the highlighted plurality of the operating elements or in the second edit mode by overwriting the alphanumeric value,
wherein the first edit mode allows for adjustment of the alphanumeric values using a most recently adjusted alphanumeric value as a starting value and adjusting the starting value, wherein the first edit mode comprises a first variation function and a second variation function, and both variation functions can be opened alternately by activating a switching key, wherein the switching key is separate from controls used to adjust the first variation function and the second variation function,
wherein a second edit mode of the at least two edit modes allows for adjustment of the alphanumeric values by directly entering alphanumeric values using a keypad, and
wherein the plurality of functional units includes baseband units configured to generate baseband signals, fading units configured to apply fading to the baseband signals, noise units configured to apply a noise signal to the baseband signals, and I/Q modulators configured to receive the baseband signals from the noise units, high-frequency units connected to the I/Q modulators and configured to send a high-frequency signal to a device under test, a signal display configured to monitor the baseband signals at various locations via switching elements, and a bit error rate tester configured to receive a signal from the device under test.

18. A method according to claim 17, wherein the first variation function allows for adjustment of an individual character of an alphanumeric character string, and wherein the second variation function allows for adjustment of an overall alphanumeric character string in increments.

19. A method according to claim 18 wherein, when the first variation function is switched on, the individual character of the displayed alphanumeric character string in an operating element is highlighted by an entry focus, and can be changed by activating a positioning element.

20. A method according to claim 19, wherein activating a direction key moves the entry focus in each case to an adjacent character in the alphanumeric character string within the operating element.

21. A method according to claim 18, wherein, when the second variation function is switched on, activating a pulse generator changes a numerically displayed value by a pre-determinable fixed increment for each pulse, and the open condition of the second variation function is indicated with the entry focus by highlighting a symbol in the operating element.

22. A method according to claim 18, wherein the second edit mode is further configured to be switched on by entering a character via the keypad, and wherein, in the second edit mode, a value of an adjustment parameter displayed alphanumerically in an operating element is overwritten by entering a sequence of characters via the keypad.

23. A method according to claim 22, wherein when a first character is entered via the keypad, the string of characters which was displayed in the operating element before the entry of the first character is deleted.

24. A method according to claim 22, wherein, when the switching key is activated in the second edit mode, a selection list for physical units is displayed.

25. A method according to claim 22, wherein a physical unit for an adjustment parameter is adjusted directly when a unit key is activated.

26. A method according to claim 17, wherein the first or second edit mode is terminated when a selection means is activated.

27. A method according to claim 17, wherein, the first or second edit mode is quit when a quit key is activated, and the values which were displayed before changing the values of the adjustment parameters are restored.

28. A measuring device according to claim 1, wherein the display device is configured to display one or more of the adjustment parameters directly in the plurality of functional blocks, and wherein the display device is configured to display an on/off indicator in one or more of the plurality of functional blocks.

29. A method according to claim 17, further comprising depicting on the display device one or more of the adjustment parameters directly in the plurality of functional blocks, and an on/off indicator in one or more of the plurality of functional blocks.

* * * * *